US005149608A

United States Patent [19]

Deibler et al.

[11] Patent Number: 5,149,608

[45] Date of Patent: Sep. 22, 1992

[54] EMULSION PRINTING PLATE RELIEF COATINGS

[75] Inventors: Dean T. Deibler; Joseph A. Marcanio, both of Cortland, N.Y.

[73] Assignee: BMC Industries, St. Paul, Minn.

[21] Appl. No.: 363,911

[22] Filed: Jun. 9, 1989

[51] Int. Cl.[5] ........ G03F 5/00

[52] U.S. Cl. ........ 430/23; 430/5; 430/271; 430/273; 430/315; 430/396; 430/494

[58] Field of Search ........ 430/5, 23, 273, 271, 430/396, 315, 325, 494

[56] References Cited

U.S. PATENT DOCUMENTS

| | | |
|---|---|---|
| 2,710,591 | 6/1955 | Mears . |
| 2,710,814 | 6/1955 | Mears . |
| 2,720,146 | 10/1955 | Mears . |
| 2,751,829 | 6/1956 | Mears . |
| 2,757,087 | 7/1956 | Wicklund . |
| 2,762,149 | 9/1956 | Mears . |
| 2,786,443 | 3/1957 | Mears . |
| 2,791,514 | 5/1957 | Mears . |
| 2,814,975 | 12/1957 | Mears . |
| 3,199,430 | 8/1965 | Brown . |
| 3,615,468 | 10/1971 | Tiala . |
| 3,669,770 | 6/1972 | Feldstein . |
| 3,897,251 | 7/1975 | Detrick et al. . |
| 4,588,676 | 5/1986 | Moscony et al. . |

*Primary Examiner*—Ellis P. Robinson
*Assistant Examiner*—J. Weddington
*Attorney, Agent, or Firm*—Jacobson & Johnson

[57] ABSTRACT

An emulsion covered photo printing plate for use in printing an echant resist pattern on a light sensitive etchant resist located on a metal web covered with an etchant resist wherein the emulsion layer contains an exterior master pattern separated from an interior master pattern by a strip line with the interior master pattern having optically clear spacers located on top of the emulsion layer opaque projections and the nonopaque emulsion layer and the exterior emulsion layer having clear spacers located on top of the exterior emulsion layer with the area of the strip line being substantially devoid of spacers to provide evacuation channel past the strip line between the exterior master pattern and the interior master pattern.

13 Claims, 3 Drawing Sheets

EMULSION PRINTING PLATE RELIEF COATINGS

FIELD OF THE INVENTION

This invention relates generally to photo printing plates and, more specifically, to relief coatings for emulsions on printing plates used to lay out etchant patterns in etchant resist on metal webs.

BACKGROUND OF THE INVENTION

In a colored cathode ray picture tube a shadow mask or aperture mask is located between the electron guns at the rear of the tube and the phosphor coated face plate at the front of the tube. Electron beams pass through tiny openings or apertures in the shadow mask and impinge upon suitable color producing phosphor dots, a triad one dot for each of the three primary colors. During operation of the picture tube the shadow mask openings are used as a guide for the electron beams.

In order to manufacture the shadow masks for use in the cathode ray tubes that are used in color monitors it is necessary to proceed through a number of steps to etch a metal web into a shadow mask having the small precision openings of proper dimensions and proper location. In a typical shadow mask manufacturing process one has to first make a photographic printing plate that is referred to as a photo printing plate for use in forming an etchant resist pattern in a layer of etchant resist located on the surface of a metal web. One of the methods used to create a photo printing plate involves applying a layer of a light sensitive emulsion to a sheet of flat glass. The emulsion layer is exposed to a light source to form a first etchant resist pattern in the emulsion. The emulsion is then developed to produce a master etchant resist pattern for defining the etchant resist pattern in the layer of etchant resist located on a metal web or sheet. Since precision etching of small openings usually requires selective etching from both sides of the metal web a second photo printing plate is created for laying out a second etchant resist pattern in the layer of etchant resist that is located on the opposite side of the metal web. Once the photo printing plates are made the user positions the photo printing plates in register on opposite sided of the metal web and in contact with the respective layer of etchant resist on the metal web. Next, one draws the photo printing plates into intimate contact with the etchant resist by evacuating the air between the photo printing plates and the layers of etchant resist on the metal web. Next one selectively exposes the light sensitive etchant resist layer through the photo printing plates. After exposing the light sensitive etchant resist to a suitable light source one develops the etchant resist. During developing, the soluble portions of the etchant resist are removed leaving a pattern of openings in the etchant resist. The openings in the etchant resist permit an operator to use an etchant to etch the metal web in the areas not protected by the etchant resist.

A commonly used light sensitive etchant resist is fish glue which is applied as a liquid and allowed to dry forming a layer of etchant resist that has a thickness of about 3 to 10 microns.

One of the problems in accurately etching openings in a metal web is the difficulty in accurately laying out the etchant resist pattern in the fish glue layers on the metal web. Two types of photo printing plates are used in the art. In the more accurate but costly process a very thin etchant resist master pattern is formed by deposition of a thin (less than 0.5 microns) layer of a metal oxide on a glass plate. In the less costly but less precise etchant resist pattern a master etchant resist pattern is formed in an emulsion layer about 3 to 5 microns thick. The actual opaque pattern is formed with emulsions sits slightly embedded in the surface of the emulsion and projects outward from the emulsion surface a distance of about one micron. Since the accuracy of the image formed in the etchant resist layer on the metal web is a function of how close the pattern on the photo printing plate is to the etchant resist layer it is extremely important that the etchant resist master pattern on the photo printing plate is in as close proximity as possible to the layer of etchant resist.

In the emulsion type printing plate one coats a glass plate with a layer of light sensitive emulsion that is about 3 microns thick. Next a primary master pattern having opaque areas and nonopaque areas is placed over the layer of emulsion. Then the light sensitive emulsion is exposed to light and developed to form an etchant resist pattern of opaque regions on top of the clear or non opaque emulsion layer. After developing the emulsion on the photo printing plate one has a photo printing plate with a etchant resist master pattern formed by a relatively soft clear compressible emulsion base with an opaque master pattern projecting about 1 micron above the top surface of the clear emulsion. To expose and develop the light sensitive etchant resist on the metal web one draws the photo printing plate with the emulsion layer and master pattern into intimate contact with the etchant resist through application of a vacuum to the region between the emulsion layer and the etchant resist. The projections from the surface of the emulsion form channels that permit the air to be evacuated from the central regions of the photo printing plate.

One of the problems with the use of thick soft emulsions for the master pattern on a photo printing plates is that the opaque master pattern projections on the emulsion form a gasket like seal with the etchant resist on the metal web. If there are any enclosed regions defined in the photo printing plate the gasket like seal makes it difficult to evacuate the air from between the emulsion layer and the etchant resist. This problem is particularly acute along the region of the master pattern that is referred to as the strip line. The strip line is a opaque band encircling a dot array pattern located on interior portion of the master pattern. During the exposing and developing of the etchant resist pattern on the etchant resist the opaque master pattern projection of the strip line is drawn into contact with the etchant resist by evacuating the air between the emulsion layer and the etchant resist layer. In the prior art processes the emulsion pattern strip lines usually have had sufficient breaks or irregularities so that gaps or breaks in the emulsion pattern strip line permit evacuation of the air from within the region defined by the strip line. With the present invention we have discovered that we do not need to rely on irregularities in the emulsion master pattern of the strip line. We preserve the accuracy of etchant resist pattern by application of a set of spacers on top of the soft emulsion base to provide a path for air to escape past the strip line. The use of spacers projecting upward from the emulsion base without any detrimental degradation of the image developed therefrom is not fully understood in view of the problems encountered with foreign particles that occasional come into contact with the tops of the opaque master pattern image on the emulsion. The foreign particles on top of the emulsion projections usually result in fracture of the emulsion opaque image when a vacuum is drawn between the emulsion layer and the etchant resist layer thus rending the photo printing plate unsuitable for use in laying out an accurate etchant resist pattern on the etchant resist on the metal web.

DESCRIPTION OF THE PRIOR ART

The Mears U.S. Pat. Nos. 2,710,591 and 2,710,814 show a machine for producing a light sensitive etchant resist coating on a metal web that is to be etched into a shadow mask.

The Mears U.S. Pat. No. 2,720,146 shows a photo printing apparatus that is used to draw the photo printing plates into surface contact with the etchant resist on the metal web.

The Mears U.S. Pat. No. 2,751,829 shows a machine for developing and heat treating the etchant resist coatings on a metal web.

The Mears U.S. Pat. No. 2,791,514 shows an apparatus and method for coating a metal web with a liquid coating of an etchant resist and than drying the coating to form a continuous etchant resist coating over a metal web.

The Mears U.S. Pat. No. 2,762,149 shows a method for etching a metal web selectively coated with an etchant resist.

The Mears U.S. Pat. No. 2,786,443 shows an apparatus for applying a coating of etchant resist to a vertically held metal web.

The Mears U.S. Pat. No. 2,814,975 shows a photo printing apparatus for holding photo printing plates in register on opposite sides of a metal web with chambers along the periphery of the photo printing plate to permit one to evacuate the air between the emulsion layer on the printing plate and the etchant resist.

The Brown U.S. Pat. No. 3,199,430 shows a photo printing apparatus for holding printing plates in register with the photo printing frame using ball socket joints.

The Wickland U.S. Pat. No. 2,757,087 shows a method of making the master etchant resist pattern that is to be formed on a photo printing plates by using a ruled glass plate having a set of opaque, parallel lines that are used to make three identical prints on a photographic film. The three prints are then overlaid one another and rotated to produce the desired pattern of openings. After producing the desired primary master pattern of openings the primary master pattern is reproduced in a light sensitive emulsion on a photo printing plate which is subsequently used to lay out the pattern of openings in the etchant resist on a metal web.

The prior art Mears and Brown patents taught the use of evacuating the region between the photo printing plate and the etchant resist to tightly sandwich the emulsion master pattern against the etchant resist. The more intimate and thorough contact between the photo printing plate and the etchant resist generally the sharper the image one can obtain. One of the problems with photo printing plates that use emulsion coatings is that the emulsion coating being relative soft sometimes form gasket like seals against the etchant resist. In order to decrease the time necessary to evacuate the air from between the emulsion master pattern and the etchant resist various types of air evacuation channels have been formed in the emulsion coating.

For example the Detrick U.S. Pat. No. 3,897,251 teaches one to expose and remove the emulsion between the opaque portions of the master pattern thereby leaving islands of emulsion master patterns with channels therebetween to permit the air to be rapidly evacuated between the photo printing plate and the etchant resist.

Still another method of decreasing the evacuation time for emulsion coated printing plates is shown in the Tiala U.S. Pat. No. 3,615,468 which teaches one to incorporate hard abrasive particles having dimensions up to 100 microns thick into the emulsion coating. The hard abrasive particles which are located in the soft emulsion extend through the emulsion to act as spacers between the photo printing plate and the etchant resist layer on the metal web thereby decreasing the evacuation time. The hard abrasive particles which are thicker than the emulsion layer extend through the emulsion layer to contact the etchant resist and prevent the etchant resist from coming into surface contact with the emulsion layer. Tiala points out that the island particles can be dispersed throughout emulsion since the light apparently diffuses around the small particles to permit exposure of the etchant resist on the metal web.

Another method of increasing the spacing between the thin hard master pattern and the etchant resist is described in Moscony et al. U.S. Pat. Nos. 4,588,676; 4,656,107 and 4,664,676. In general the Moscony et al. prior art patents vapor deposit a hard thin iron oxide coating on a glass master plate to form a photo printing plate. The iron oxide coatings may be up to twenty times thinner than the emulsion coatings. The thinner coatings also make it difficult to quickly evacuate the region between the printing plate and the etchant resist layer on the metal web. In order to minimize the delay in evacuating the air from between the photo printing plate and the coating of etchant resist on the metal webs the Moscony et al. patents like Tiala have built islands or spacers to provide larger evacuation paths. The Moscony et al. patents place rubbery islands on top of the thin, hard master pattern and the glass support plate to provide deeper evacuating channels between the master pattern and the etchant resist.

More specifically the Moscony et al. U.S. Pat. Nos. 4,588,676; 4,656,107 and 4,664,676 teach the placement of rubbery islands over the thin hard master patterns to provide deeper channels for the air to be evacuated from between the master pattern and the etchant resist. Tiala uses islands of hard abrasive particles that extend down to the glass support plate to provide the spacing support thereby increasing the depth of the channels which decreases the evacuation time necessary to remove air form between the emulsion and the etchant resist layer on the metal web. Moscony et al. points out that the problems in providing evacuation channels in the emulsion coated printing plates are grossly different than the problems in providing evacuation channels for master patterns of hard, non-tapered, grossly-thinner, fully-opaque portions. In its prosecution history Moscony et al points out "that the fact that the coating is rubbery has little effect on a structure with an emulsion master pattern (which is compressible), but this feature produces substantial benefits in combination with the grossly thinner master pattern . . . " In contrast to the teachings of Moscony et al and Tiala that use a hard glass surface for their spacer particles the present invention utilizes spacers not on the glass support surface but on top of both the opaque and the nonopaque compressible emulsion pattern. The spacers form larger evacuation channels between the emulsion master pattern the etchant resist layer on the metal web. In addition by positioning the spacers on regions other than the strip lines one can provide for the rapid evacuation of air from between the emulsion layer and the etchant resist that are located on the interior regions of the photo printing pattern.

Another prior art patent is the Wetzel et al. U.S. Pat. No. 4,669,871 which lists as one of its inventors Dean Deibler a coinventor of the present invention. The Wetzel et al. patent teaches one to substitute the prior are randomly cut air evacuation grooves in the peripheral area of the hard thin coatings master for more precisely defined channels of rubbery material that are located directly on the surface of the glass support plate. The air evacuation channels formed in the peripheral area are larger than the channels located on the central region of glass to thereby insure that the air can be rapidly evacuated from between the hard master pattern and the etchant resist.

SUMMARY OF THE INVENTION

Briefly, the present invention comprises a photo printing plate having the combination of a compressible emulsion layer with spacers of a first height located partially on top of the opaque pattern that projects outward from the compressible emulsion layer and partially on top of the nonopaque compressible emulsion layer adjacent to the opaque pattern to provide larger evacuation channels over the compressible emulsion surface and the strip line without substantially degrading the image that can be formed on a layer of etchant resist with the photo printing plate. The areas defined by the strip lines containing substantially no spacers to permit the air to be evacuated over the strip lines and between the emulsion layer on the photo printing plate and the etchant resist coating on the metal web. In the region outside the strip lines the spacers are supported entirely on top of the compressible emulsion layer to provide peripheral spacing support for the printing plate.

DESCRIPTION OF THE PREFERRED EMBODIMENT

Figure 1:
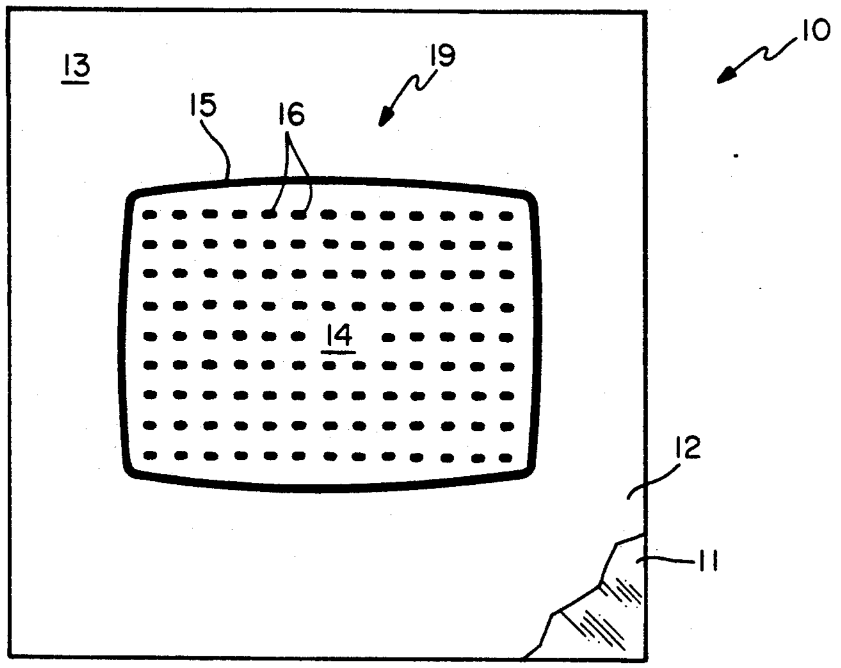
FIG. 1 (PRIOR ART)
FIG. 1 shows a front view of a prior art photo printing plate with an emulsion coating having an opaque master pattern defined in the emulsion coating.

Referring to FIG. 1 reference numeral 10 identifies a conventional photo printing plate 10 having a flat glass support plate 11 with a compressible emulsion layer 12 extending over the surface of a glass plate 11. Located in and projecting outward from emulsion 12 is an opaque pattern formed by a set of opaque regions 19 that are to be used to layout the exposed metal pattern in a layer of etchant resist on a metal web. FIG. 1 shows the opaque master pattern outline of a shadow mask 19 comprising a central located set of elongated opaque regions 16 and an encircling opaque band 15 that is referred to as a strip line. The purpose of the opaque elongated regions 16 is to define the exposed metal regions in the etchant resist that form the boundaries of the openings through the shadow mask. The purpose of the opaque strip line 15 is to define the exposed metal regions in the etchant resist that form the boundaries of the shadow mask. When the exposed metal regions are etched away one forms an etched shadow mask that can be cleanly removed from the metal web without introducing stress to the shadow mask that may cause distortions of the mask during use in a picture tube. Located outside strip line 15 is an outer clear or non opaque annular like region 13 and located between strip line 15 and the elongated pattern 16 is an inner annular like clear or non opaque boundary region 14. While elongated regions are shown other shapes such as circular or the like could be used.

Figure 2:
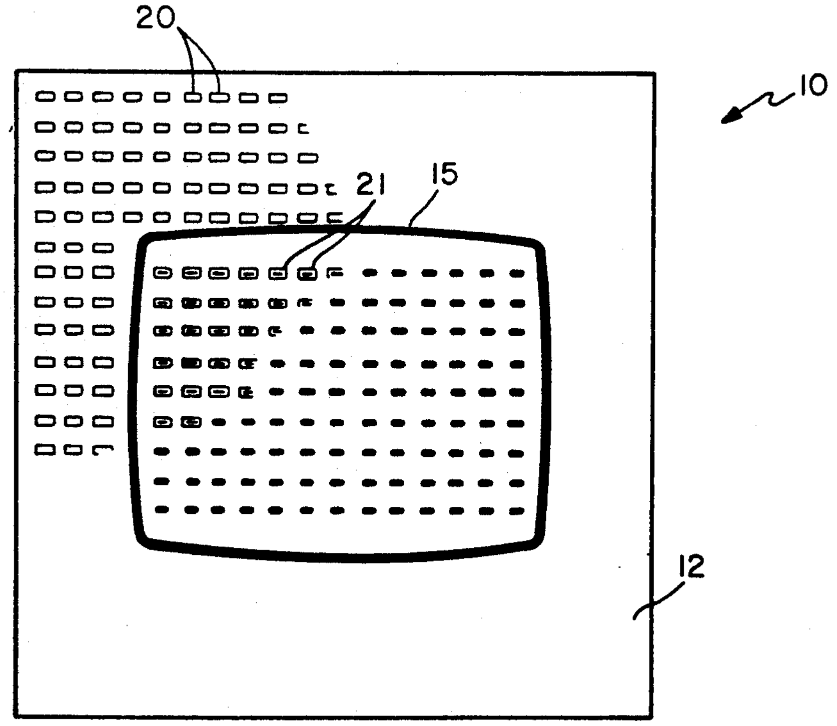
FIG. 2 shows a front view of the photo printing plate of FIG. 1 overlaid with spacers.

FIG. 2 shows photographic plate 10 with an overlay of a plurality of clear or nonopaque spacers 20 that are selectively and substantially uniformly spaced over the photo printing plate 10 with the exception of the strip line 15. Spacers 20 are typically formed from resin materials such as polyvinyl cinnamate derivatives which are commercially available under tradenames such as Waycoat RC and KPR. Spacers 20 can be formed by conventional techniques of applying a layer of material on top of the emulsion layer and then exposing, developing and washing away the undesired area to leave a plurality of spacers located throughout the surface of the emulsion layer. The spacers 20 are located in a substantially uniform pattern throughout the entire surface region of the emulsion coated printing plate 10 with the exception of the opaque region 15 that defines the strip line.

Figure 3:
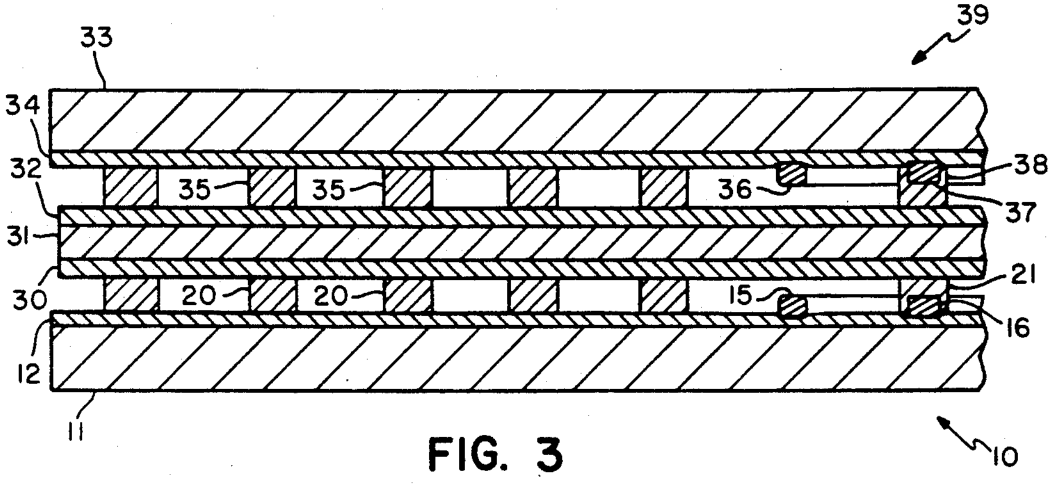
FIG. 3 shows a side view of the photo printing plate of FIG. 2 and a second photo printing plate in register on opposite sides of layers of etchant resist on a metal web.

In order to understand the operation of my spacers and the position of the spacers reference should be made to FIG. 3 which shows a sectional end view of a portion of pair of photo printing plates 10 and 39 sandwiched against a light sensitive etchant resist coated metal web 31. Located in the center of FIG. 3 is metal web 31 having a first layer of light sensitive etchant resist 32 on one side of metal web 31 and a second layer of light sensitive etchant resist 30 located on the opposite side of metal web 31. Typically, the light sensitive etchant resist layers 30 and 32 comprise fish glue or the like. To form the light sensitive etchant resist layers 30 and 32 into an etchant resistant surface the light sensitive etchant resists are exposed to a light source, developed, and then washed away thus leaving exposed metal areas in the etchant resist. By applying an etchant to the exposed metal web one can form precision openings through the metal web. Typically, steel webs are etched through with an etchant such as ferric chloride.

Located in intimate contact with layer of etchant resist 30 is the top surfaces of the photo printing plate 10 and located in intimate contact with the layer of etchant resist 32 is the top surface of photo printing plate 39. The top surfaces of photo printing plates 10 and 39 are brought into intimate contact with the respective layers of etchant resist through the type of prior art printing frames as shown in assignees prior art Brown U.S. Pat. No. 3,199,430 and Mears U.S. Pat. No. 2,814,975. To obtain intimate contact between the printing plates and the layers of etchant resist the air is evacuated between the etchant resist layers and the photo printing plates to draw the surface of the printing plate into intimate contact with the light sensitive etchant resist 32 and 30.

FIG. 3 shows that a path for evacuation of air between emulsion layer 12 and the etchant resist 30 is provided for by the post like spacers 20 and 21. Similarly, the post like spacers 35 and 38 provide a path for evacuation of air between emulsion layer 34 and etchant resist 32.

Figure 4:
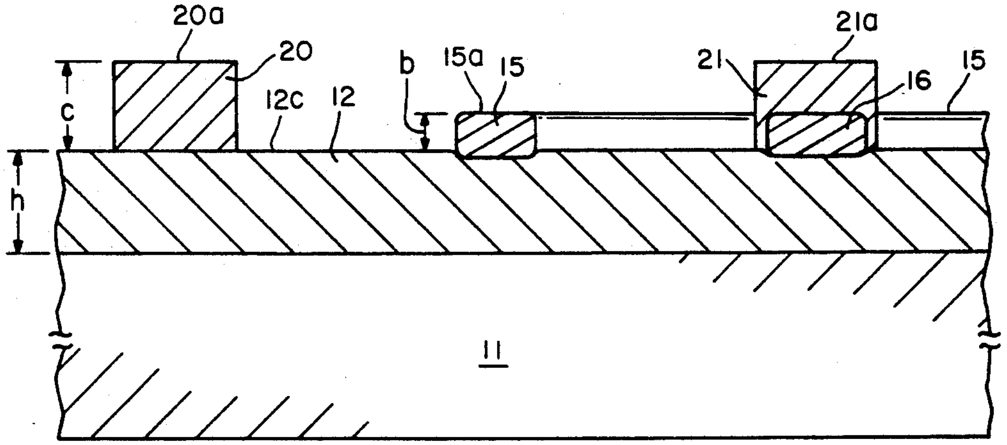
FIG. 4 shows an enlarged sectional view of a portion of the printing plate of the present invention.

In order to appreciate the relative height and the location of the spacers with respect to the strip line reference should be made to FIG. 4 which shows a compressible emulsion layer 12 of thickness h of 3 microns, a peripheral spacer 20 of height c of 2.5 microns and an opaque strip line 15 and an opaque pattern 16 having a height b of one micron. A closer inspection of the spacers 20 and 21 shows that peripheral spacers 20 are located entirely on the clear or nonopaque compressible emulsion on the peripheral regions of glass plate 11. Located in the central area of the printing plates and supported partially on the compressible emulsion layer and partially on the opaque pattern 16 are clear spacers 21. FIG. 4 also shows that there are substantially no spacers located on the opaque strip line 15 thereby providing an air evacuation path over the barrier formed by the encircling strip line 15. Thus the present invention through the use of two types of clear spacers located either entirely on the compressible emulsion 12 or partially on the compressible emulsion 12 and partially on the opaque pattern 16 provides air evacuation channels from the central region of the photo printing plate to the peripheral region of the photo printing plate over strip line 15. In addition the use of spacers both on top of the master pattern located on the emulsion layer and on top of the non opaque emulsion pattern produces air evacuation paths that permit a user to quickly evacuate the air from between the emulsion layer and the etchant resist.

Figure 5:
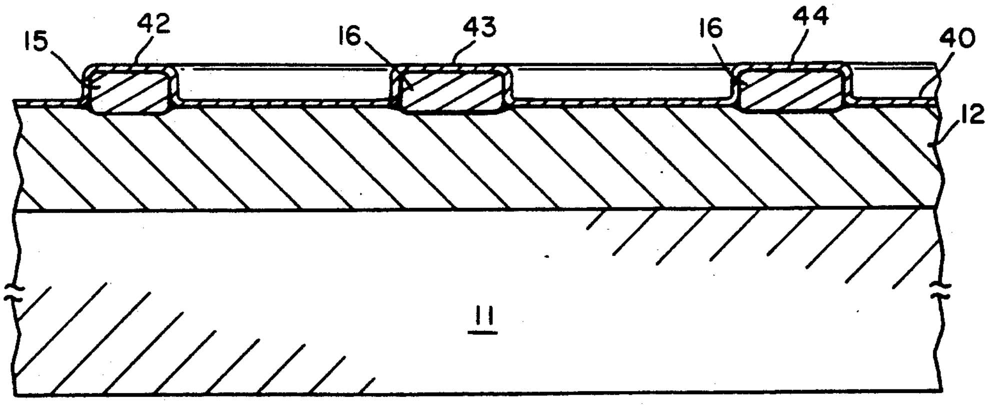
FIG. 5 (PRIOR ART)
FIG. 5 shows a partial sectional view of a portion of a prior art emulsion image in cross section.

FIG. 5 shows a cross sectional view of a portion of a prior art emulsion printing plate 10 in the region of opaque master patterns 16. Typically, the prior art photo printing plates include a continuous thin coating of a release or wear agent such as silicone layer 40. Protective silicone layers have been used to prevent dirt from adhering to the face of the printing plate during the use and reuse of the printing plates. It has been found that if particles come into contact with the opaque projection which are usually silver emulsion the opaque silver projections may fracture and thus render the opaque pattern unsuitable for use in laying out patterns in the etchant resist. The prior art use of the silicone layer 40 was used to protect the top surfaces of the opaque emulsions from accidental having to support any foreign object. Ironically, in contrast to the prior art that attempted to avoid placement of foreign objects on top of the opaque projections the present invention deliberately places spacers on top of the opaque projections and on the compressible emulsion layer adjacent the opaque projections.

Figure 6:
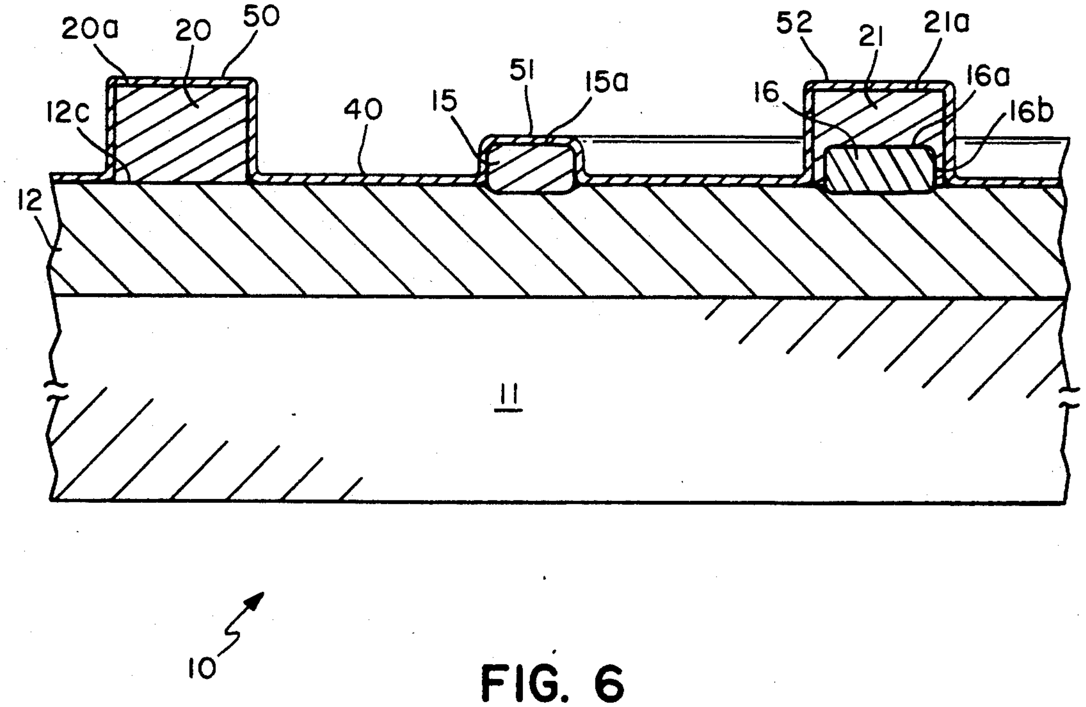
FIG. 6 shows a sectional view of a portion of the present invention coated with a layer of silicone.

In order to compare the evacuation paths formed by the present invention and the prior art reference should be made to FIG. 5 and FIG. 6. FIG. 5 shows a prior art emulsion master pattern on a photo printing plate 10. Located on emulsion layer 12 are the opaque master patterns 16 that represent the interior region of the mask and the opaque master patterns 15 that represents the continuous strip line. Located on top of the emulsion layer is a coating of silicone 40 that is used to prevent dirt particles from clinging to the photo printing plate during use and reuse of the photo printing plates. During the printing process the layer of etchant resist on the metal web would be in contact with top surfaces 42, 43, and 44. Note that in the prior art without the island spacers such as shown in Tiala the evacuation paths from the center of the mask to the outside region of the mask are obstructed unless one forms breaks or irregularities in strip line 15.

In contrast FIG. 6 shows an enlarged sectional view similar to FIG. 5 with interior spacers 21 located on interior emulsion opaque patters 16 and peripheral spacers 20 located on the region outside of the strip line 15. In order to keep dirt particles off the photo printing plate a thin layer of silicone 40 is located over emulsion 12 and the emulsion projections. During the process of forming the image in the etchant resist a layer of etchant resist would be placed in contact with top surface 50 that is located on top surface 20*a* of spacer 20 and on top surface 52 that is located on top surface 21*a* of spacer 21. FIG. 6 shows that the strip line 15 is substantially free of any spacers so that the air can be quickly and easily evacuated from the region interior to the strip line. Thus the present invention provides for the removable of air from between the emulsion layer and the etchant resist by placement of spacers on top of the emulsion layer rather than in contact with the glass support plate as described in Tiala and as shown in the Moscony et al. patents.

We claim:

1. An emulsion coated printing plate for laying out a shadow mask pattern in etchant resist on a metal web comprising:

- a transparent plate having a top surface;
- a layer of compressible emulsion located on said top surface, said layer of compressible emulsion having a first surface;
- a first opaque master pattern located on said first surface, said first opaque master pattern projects upward from said first surface of said emulsion to define a channel for evacuation of air between said first surface of said emulsion and a layer of etchant resist;
- a strip line having a second opaque master pattern enclosing said first opaque master pattern, said strip line located on said layer of compressible emulsion, said strip line defining a compressible emulsion interior region being encompassed by said strip line and a compressible emulsion exterior region located outside said strip line;
- a plurality of first spacers located on said first opaque master pattern to space said first opaque master pattern from a layer of etchant resist; and
- a plurality of second spacers located on and supported by said layer of compressible emulsion in said exterior region, said layer of compressible emulsion in said exterior region spacing said compressible emulsion layer in said exterior region from a layer of etchant resist so that the air can be evacuated from said interior region through said exterior region whereby an air evacuation channel is provided over said strip line by said first plurality of spacers and said second plurality of spacers.

2. The emulsion coated printing plate of claim 1 wherein said plurality of second spacers are located entirely on top of said first surface of said compressible emulsion in said exterior region.

3. The emulsion coated printing plate of claim 2 wherein said second opaque master pattern comprises projections extending about one micron above said layer of compressible emulsion.

4. The emulsion coated printing plate of claim 3 wherein said spacers are spaced substantially uniformly over said emulsion.

5. The emulsion coated printing plate of claim 4 wherein no spacers are located on said strip line.

6. The emulsion coated printing plate of claim 5 wherein said spacers and said compressible emulsion are covered with a silicone layer to prevent dirt particles from adhering to said printing during use and reuse.

7. An emulsion coated printing plate for printing an etchant resist pattern on a resist coated material by evacuating the air from between the printing plate and the resist coated material to bring the printing plate and the resist coated material into close proximity to produce a sharp image in the resist coated material comprising:

a transparent plate having a top surface;

a layer of non opaque emulsion having first surface extending over said top surface;

an opaque master pattern located on said nonopaque emulsion to provide opaque regions that extend upward from said first of said nonopaque emulsion; and a plurality of spacers supported by said non opaque emulsion said plurality of spacers located on top of said first surface and on top of said opaque regions to form evacuation channels so that when said emulsion coated printing plate is placed against a second surface one can quickly remove the air from between said printing plate and said second surface.

8. The emulsion coated printing plate of claim 7 wherein said plurality of spacers are spaced substantially uniformly over said first surface of said nonopaque emulsion.

9. The emulsion coated printing plate of claim 7 wherein said plurality of spacers are partially located on said nonopaque emulsion and partially on said opaque master pattern.

10. The emulsion coated printing plate of claim 8 wherein said spacers extend approximately 3 microns above said top surface to thereby define air evacuation channels between said spacers.

11. The emulsion coated printing plate of claim 10 wherein said layer of nonopaque emulsion is about 3 microns thick.

12. The emulsion coated printing plate of claim 11 wherein said spacers project a minimum of 2 microns above said layer of nonopaque emulsion.

13. The emulsion coated printing plate of claim 12 wherein said spacers are positioned in a regular pattern throughout the first surface.

* * * * *